(12) United States Patent
Todd

(10) Patent No.: US 6,630,413 B2
(45) Date of Patent: Oct. 7, 2003

(54) CVD SYNTHESES OF SILICON NITRIDE MATERIALS

(75) Inventor: Michael A. Todd, Phoenix, AZ (US)

(73) Assignee: ASM Japan K.K. (JP)

( * ) Notice: Subject to any disclaimer, the term of this patent is extended or adjusted under 35 U.S.C. 154(b) by 8 days.

(21) Appl. No.: 09/843,456

(22) Filed: Apr. 26, 2001

(65) Prior Publication Data

US 2002/0016084 A1 Feb. 7, 2002

Related U.S. Application Data

(60) Provisional application No. 60/200,676, filed on Apr. 28, 2000, and provisional application No. 60/202,102, filed on May 4, 2000.

(51) Int. Cl.$^7$ ............................................. H01L 21/324
(52) U.S. Cl. .................... 438/795; 438/758; 438/775; 438/780; 438/781; 438/789; 438/790; 438/791
(58) Field of Search .................... 438/758, 775, 438/780, 781, 789, 790, 791, 795

(56) References Cited

U.S. PATENT DOCUMENTS

| | | | |
|---|---|---|---|
| 4,118,539 A | 10/1978 | Hirai et al. | |
| 4,200,666 A | * 4/1980 | Reinberg | 427/579 |
| 4,452,875 A | 6/1984 | Ogawa et al. | 430/57 |
| 4,481,229 A | 11/1984 | Suzuki et al. | |
| 4,720,395 A | * 1/1988 | Foster | 438/791 |
| 4,737,379 A | 4/1988 | Hudgens et al. | |
| 4,854,263 A | 8/1989 | Chang et al. | |
| 4,894,352 A | 1/1990 | Lane et al. | |
| 4,933,206 A | * 6/1990 | Cox | 219/121.66 |
| 4,992,299 A | * 2/1991 | Hochberg et al. | 427/248.1 |
| 5,234,609 A | 8/1993 | Kashida et al. | 252/1 |
| 5,326,649 A | 7/1994 | Kashida et al. | |
| 5,508,067 A | 4/1996 | Sato et al. | |
| 5,616,754 A | 4/1997 | Cruse et al. | 556/409 |
| 5,731,238 A | 3/1998 | Cavins et al. | |
| 5,763,021 A | 6/1998 | Young et al. | 427/579 |
| 6,153,541 A | 11/2000 | Yao et al. | |
| 6,284,583 B1 | * 9/2001 | Saida et al. | 438/791 |
| 6,326,064 B1 | * 12/2001 | Denison et al. | 438/787 |

FOREIGN PATENT DOCUMENTS

| | | |
|---|---|---|
| EP | 0 928 051 A2 | 7/1999 |
| WO | Wo 00/03425 | 1/2000 |

OTHER PUBLICATIONS

Japan Abstract No. 62253771 A, Nov. 5, 1987.
Japan Abstract No. 6338497 A, Dec. 6, 1994.
Tina J. Cotler and Jonathan Chapple–Sokol, "High Quality Plasma–Enhanced Chemical Vapor Deposited Silicon Nitride Films", Journal of the Electrochemical Society, vol. 140, No. 7, Jul. 1993.
S. Wolf and R. Tauber, "Silicon Processing for the VLSI Era," vol. 1, Lattice Press, Sunset Beach, CA, p. 176 (2000).

* cited by examiner

Primary Examiner—Kamand Cuneo
Assistant Examiner—Lisa Kilday
(74) Attorney, Agent, or Firm—Knobbe Martens Olson & Bear LLP

(57) ABSTRACT

Low hydrogen-content silicon nitride materials are deposited by a variety of CVD techniques, preferably thermal CVD and PECVD, using chemical precursors that contain silicon atoms, nitrogen atoms, or both. A preferred chemical precursor contains one or more N—Si bonds. Another preferred chemical precursor is a mixture of a N-containing chemical precursor with a Si-containing chemical precursor that contains less than 9.5 weight % hydrogen atoms. A preferred embodiment uses a hydrogen source to minimize the halogen content of silicon nitride materials deposited by PECVD.

12 Claims, No Drawings

CVD SYNTHESES OF SILICON NITRIDE MATERIALS

RELATED APPLICATION INFORMATION

This application claims priority under 35 U.S.C. §119(e) to the following U.S. provisional applications: Ser. No. 60/200,676, filed Apr. 28, 2000 and Ser. No. 60/202,102, filed May 4, 2000, each of which is hereby incorporated by reference in its entirety.

BACKGROUND OF THE INVENTION

1. Field of the Invention

This invention relates generally to silicon nitride materials useful in the semiconductor industry, and more particularly to deposition methods for making silicon nitride materials having a low hydrogen content.

2. Description of the Related Art

Silicon nitride materials are widely used in the semiconductor industry as gate dielectrics for amorphous silicon and III–V compound semiconductor transistors, insulators between metal levels, masks to prevent oxidation and diffusion, etch masks in multilevel photoresist structures, passivation layers and as spacer materials in transistors.

Silicon nitride materials are typically deposited onto the substrate by decomposing chemical precursors in the presence of the substrate. The properties of the deposited silicon nitride material generally depend upon the deposition method. For a number of semiconductor applications, low hydrogen content ("H-content") is desirable. Conventional silicon nitride is said to contain 20–30 atomic % hydrogen, see U.S. Pat. No. 4,854,263.

A number of methods are used to deposit silicon nitride films, including thermal chemical vapor deposition ("thermal CVD") and plasma-enhanced chemical vapor deposition ("PECVD"). It is generally recognized that low H-content silicon nitride can be deposited by thermal CVD using high deposition temperatures. For example, U.S. Pat. No. 5,326,649 discloses the use of $NH_3$ (ammonia) as the nitrogen source and $SiH_4$ (silane) as the silicon source to make low-H content silicon nitride materials at temperatures in the range from 900° to 1500° C. Thermal CVD methods that utilize ammonia and silane are apparently favored because those precursors are widely available and relatively inexpensive. However, such high temperature methods may be incompatible with many process steps in the semiconductor manufacturing process. Thermal CVD using ammonia and silane at lower temperatures generally results in relatively high H-content silicon nitride films. U.S. Pat. No. 4,720,395 discloses the use of $NF_3$ (nitrogen trifluoride) and $H_3SiSiH_3$ (disilane) in a mole ratio of about 0.5 to about 3.0 to deposit silicon nitride at a temperature in the range of 250°–500° C. The H-content of the films produced by this process is not disclosed, but is likely to be relatively high because of the low deposition temperatures and the relatively high H-content of disilane.

Various PECVD techniques utilize precursors that contain significant amounts of hydrogen. JP 62253771A discloses a PECVD technique for depositing silicon nitride using $H_nSi(NH_2)_{4-n}$, where n is 1, 2 or 3. U.S. Pat. No. 5,731,238 employs jet vapor deposition using silane and $N_2$ (nitrogen) as precursors to make silicon nitride. The PECVD method of JP 6338497A utilizes $(SiH_3)_3N$ (trisilylamine) and ammonia to make silicon nitride and oxynitride films. When ammonia is used as the nitrogen source, PECVD has been found to produce silicon nitride having generally higher levels of hydrogen. For example, U.S. Pat. No. 4,854,263 notes that, as a consequence of using ammonia to obtain acceptable deposition rates and throughput, the concentration of hydrogen in the deposited silicon nitride can be quite high, as much as 25–30 atomic percent.

Attempts have been made to reduce H-content by eliminating ammonia from the deposition process. For instance, U.S. Pat. No. 4,854,263 discloses a method for making a silicon nitride film having a hydrogen content of 5–7 atomic percent by using $SiH_4/N_2/NF_3$ in a PECVD process that utilizes a particular inlet gas manifold. U.S. Pat. No. 4,854,263 also discloses a similar process for making silicon oxynitride films having a hydrogen content of less than six atomic percent using $SiH_4/N_2/N_2O$. WO 00/03425 discloses a PECVD process that utilizes silane and nitrogen. The PECVD method disclosed in U.S. Pat. No. 5,508,067 utilizes a precursor gas mixture that contains an inorganic silane, a nitrogen-containing organosilane and a nitrogen-containing gas. A variety of precursors are mentioned, some of which contain hydrogen and some of which do not, but the deposition of silicon nitride using a hydrogen-containing precursor mixture of $(CH_3)_3NN(CH_3)_3$ (hexamethyldisilazene), silane, ammonia and nitrogen is exemplary.

Problems have been encountered when entirely hydrogen-free precursors are used to make low H-content silicon nitride. U.S. Pat. No. 4,481,229 discusses the etching problems encountered when attempting to make hydrogen-free films using halogenide silicon gases such as $SiF_4$, $SiCl_4$, $SiF_3Cl$, or $SiBr_4$ in place of SiH4 and purports to provide a solution in the form of a particular plasma technique. That patent discloses the deposition of a Si—N film using $SiF_4$ and $N_2$ or $NF_3$ as precursors. However, U.S. Pat. No. 4,737,379 states that practical deposition systems utilizing this art will require the creation and control of a uniform, large magnetic field throughout the plasma volume. U.S. Pat. No. 4,737,379 also states that such a system will require the use of microwave tuning and applicator technology capable of coupling microwave energy into a plasma impedance which is changing rapidly near the resource condition. According to U.S. Pat. No. 4,737,379, the additional technological complications brought about by these requirements have significant economic consequences for manufacturing machines employing this art. Thus, the art does not appear to recognize U.S. Pat. No. 4,481,229 as providing a satisfactory method for making low-H content silicon nitride materials. The PECVD method disclosed in U.S. Pat. No. 4,737,379 for making low-H content films utilizes a feedstock gas that is hydrogen-free, i.e., free of combined hydrogen, silanes, partially halogenated silanes, and partially substituted hydrocarbons. Hydrogen-free silicon nitride is not always desirable, however, so that patent discloses the use of molecular hydrogen ($H_2$) to modify the properties of the deposited film.

There remains a need for low-H content silicon nitride materials having better properties more suitable for use in microelectronics manufacturing, and for processes for producing such materials that can be readily integrated into fabrication process flows.

SUMMARY OF THE INVENTION

The inventor has discovered various ways of depositing silicon nitride materials onto surfaces. In preferred embodiments, the deposited silicon nitride materials have a relatively low content of hydrogen. Such silicon nitride materials and processes are particularly useful for making microelectronic devices such as integrated circuits.

In one embodiment, a process is provided for depositing a silicon nitride material from vapor phase precursors on a surface, comprising providing a deposition chamber having disposed therein a substrate; and introducing a chemical precursor to the chamber, wherein the chemical precursor is comprised of one or more N—Si chemical bonds, thereby depositing a silicon nitride material onto the substrate by thermal decomposition.

In another embodiment, a thermal chemical vapor deposition process is provided, comprising placing an integrated circuit into a chemical vapor deposition chamber, heating the integrated circuit to a temperature in the range of about 500° C. to about 650° C., and adding a chemical precursor to the chemical vapor deposition chamber to thereby deposit a material onto the integrated circuit, wherein the chemical precursor is selected from the group consisting of $(X_3Si)_3N$, $(X_3Si)_2N$—$N(SiX_3)_2$, $(X_3Si)N$=$N(SiX_3)$, and $(R_{3-m}SiX_m)_3N$; wherein m is 0, 1 or 2; wherein each X is individually selected from the group consisting of F, Cl, Br, H and D; and wherein each R is individually selected from the group consisting of methyl, ethyl, phenyl and tertiary butyl.

In another embodiment, a process is provided for depositing a silicon nitride material, comprising creating a mixture comprised of a N-containing chemical precursor and a Si-containing chemical precursor, wherein the mixture is created in the presence of a substrate contained within a chemical vapor deposition chamber, and thereby depositing a silicon nitride material onto the substrate by thermal chemical vapor deposition, wherein the Si-containing chemical precursor contains less than 9.0% hydrogen atoms, by weight based on total weight of the Si-containing chemical precursor.

In another embodiment, a method of controlling the properties of a PECVD-deposited silicon nitride material is provided, comprising: providing a plasma-enhanced chemical vapor deposition process that utilizes a halide-containing chemical precursor to deposit a low hydrogen-content silicon nitride material, and introducing to the plasma-enhanced chemical vapor deposition process a hydrogen source represented by the formula $SiH_nX_{4-n}$, wherein n is 1, 2 or 3 and X is F or Cl, wherein the hydrogen source is used in an amount that is effective to reduce the halogen content of the low hydrogen-content silicon nitride material.

These and other embodiments are described in greater detail below.

DETAILED DESCRIPTION OF THE PREFERRED EMBODIMENTS

As employed herein, silicon nitride materials are comprised predominately of the elements silicon and nitrogen. The weight of silicon and nitrogen together in silicon nitrogen materials is preferably at least about 50%, more preferably at least about 65%, by weight based on total weight. The ratio of silicon to nitrogen atoms (Si:N) in silicon nitride materials is preferably in the range of about 2,000:1 to about 3:5, more preferably in the range of about 1,000:1 to 3:4. Silicon nitride materials can also be alloys that contain additional elements such as carbon, oxygen, and germanium. Preferred ranges for Si, N, C, O, and Ge in silicon nitride materials are shown in Table 1 on a percentage basis, by weight based on total weight. Table 1 is to be read as if the word "about" preceded each numeral.

TABLE 1

| Element | Preferred range, wt % | More preferred range, wt % |
|---------|----------------------|---------------------------|
| Si | 30–99.5 | 40–99.5 |
| N | 0.25–40 | 0.4–42 |
| O | 0–49.9 | 0–24.9 |
| C | 0–49.9 | 0–24.9 |
| Ge | 0–49.9 | 0–24.9 |

Terms such as Si—N ("silicon nitride"), Si—O—N ("silicon oxynitride"), Si—C—N ("silicon carbonitride") and Si—O—C—N ("silicon oxycarbonitride") are often used to refer to silicon nitride materials. These terms are not chemical formulas in the usual sense because they are not indicative of the overall stoichiometry of the material to which they refer. Si—N is a silicon nitride material that contains at least the elements silicon and nitrogen, and may also contain additional elements. Likewise, Si—O—N is a silicon nitride material that contains at least the elements silicon, oxygen, and nitrogen, and may also contain additional elements. Also, Si—C—N is a silicon nitride material that contains at least the elements silicon, carbon and nitrogen, and may also contain additional elements. Similarly, Si—O—C—N is a silicon nitride material that contains at least the elements silicon, oxygen, carbon, and nitrogen, and may also contain additional elements.

Silicon nitride materials can contain additional elements other than those shown in Table 1. Such additional elements can include, without limitation, hydrogen, fluorine, chlorine, bromine, and iodine. Halogen atoms may be present as by-products of the deposition process or may be added deliberately. Amounts of halogen atoms are preferably about 20% or less, more preferably about 10% or less, even more preferably about 5% or less, by weight based on total weight of silicon nitride material.

Preferred silicon nitride materials contain reduced hydrogen levels as compared to silicon nitride made by conventional processes. Silicon nitride materials preferably contain about 15 atomic % or less of H atoms, more preferably about 10 atomic % or less, even more preferably about 8 atomic % or less, most preferably about 4 atomic % or less, based on total atomic content of silicon nitride material. Hydrogen content is preferably measured by Rutherford backscattering spectroscopy using elastic recoil detection ("RBS/ERD").

The H-content of silicon nitride materials can be measured on an "as is" or "as deposited" basis. "As deposited" refers to the H-content of the silicon nitride material at the time of deposition or soon thereafter, before any additional significant processing steps have taken place. The H-content of a silicon nitride material can often be changed by such processes as heating or by subsequent chemical treatment, which may be for the particular purpose of reducing H-content or for other purposes related to subsequent processing steps. The "as is" H-content refers to the H-content of the silicon nitride material at any particular point in time. It may be measured immediately after deposition, in which case the "as is" H-content is the same as the "as deposited" H-content. It may also be measured after subsequent processing steps have increased or decreased the H-content, in which case the "as is" H-content will be different from the "as deposited" H-content. Preferably, the "as is" H-content is the H-content of silicon nitride in an integrated circuit that is the final product of a manufacturing process. In the absence of the terms "as is" or "as deposited," reference herein to the H-content of a silicon nitride refers to the "as is" H-content.

Silicon nitride materials can be in various forms such as particles or fibers, but are preferably in the form of a film. "Film" is used in its usual sense to include both freestanding films and layers or coatings applied to substrates. A film can be flat or it can conform to an underlying three-dimensional surface, and in either case can have a constant or variable thickness, preferably constant. Preferably, the average thickness of the film is effective to provide the desired function, e.g. diffusion barrier, gate dielectric, passivation layer, spacer material, etc. Frequently, the average film thickness is in the range of about a monolayer thickness of about 4 Å to about 10,000 Å, preferably about 10 Å to about 3,000 Å, more preferably about 200 Å to about 2,000 Å.

The silicon nitride materials described herein are preferably deposited onto a substrate. "Substrate" is used in its usual sense to include any underlying surface onto which the silicon nitride material is deposited or applied. Preferred substrates can be made of virtually any material, including without limitation metal, silicon, germanium, plastic, and/or glass, preferably silicon, silicon compounds (including Si—O—C—H low dielectric constant films) and silicon alloys.

Particularly preferred substrates include silicon substrates, e.g. silicon wafers and layers of Group III–V materials used in the fabrication of microelectronics, and integrated circuits. "Integrated circuit" is used in its usual sense in the microelectronics field to include substrates onto which microelectronic devices have been or are to be applied, and thus includes integrated circuits that are in the process of being manufactured and which may not yet be functional. In the field of integrated circuit fabrication, the semiconductor substrate generally refers to the lowest level of semiconductor material from which devices are formed.

Various processes utilizing the chemical precursors described herein may be used to deposit silicon nitride materials. As used herein, a "chemical precursor" is a chemical that contains the elements silicon and/or nitrogen that can be activated or chemically reacted under the conditions described herein to form a silicon nitride material. Chemical precursors are preferably silicon-containing ("Si-containing"), chemical compounds, nitrogen-containing ("N-containing") chemical compounds, or chemical compounds that contain both silicon and nitrogen ("Si—N-containing"). In a preferred embodiment, at least a part of the silicon and nitrogen atoms in the resulting silicon nitride material are supplied by a Si—N-containing chemical precursor that is comprised of one or more N—Si bonds. In another preferred embodiment, at least part of the silicon and nitrogen atoms are supplied by a mixture of a Si-containing chemical precursor and a N-containing chemical precursor.

Preferred chemical precursors are comprised of one or more N—Si bonds, more preferably contain fewer N—H bonds than N—Si bonds, and even more preferably are substantially free of N—H bonds. Examples of preferred chemical precursors include, without limitation, molecules represented by the formulas $(X_3Si)_3N$, $(X_3Si)_2N—N(SiX_3)_2$, $(X_3Si)N=N(SiX_3)$, and $(R_{3-m}SiX_m)_3N$; wherein m is 0, 1 or 2; wherein each X is individually selected from the group consisting of F, Cl, Br, H and D; and wherein each R is individually selected from the group consisting of methyl, ethyl, phenyl or tertiary butyl. Non-limiting examples of preferred chemical precursors include $(H_3Si)_3N$, $(H_3Si)_2N—N(SiH_3)_2$, and $(H_3Si)N=N(SiH_3)$.

This invention is not bound by theory, but it is believed that N—H bonds are difficult to thermally eliminate, so that deposition processes utilizing chemical precursors that include N—H bonds tend to produce silicon nitride materials having a higher H-content. For example, during silicon nitride deposition processes that utilize $NH_3$ as a source of nitrogen atoms, it is believed that at least some of the hydrogen atoms in the deposited silicon nitride are in the form of N—H bonds that survive, or that are reformed during, the deposition process. Thus, $(H_3Si)_3N$ is a preferred chemical precursor because it contains three N—Si bonds and because it is free of N—H bonds.

A preferred embodiment utilizes a mixture of a Si-containing chemical precursor and a N-containing chemical precursor. Preferred Si-containing chemical precursors are molecules represented by the formulas $SiX_4$, $X_3SiSiX_3$, $X_3SiSiX_2SiX_3$, $SiX_nR_{4-n}$, $(X_3Si)_{4-n}CX_n$, and $(R_{3-n}SiX_n)_2O$; wherein n is 0, 1, 2 or 3; wherein each X is individually selected from the group consisting of F, Cl, H and D; and wherein each R is individually selected from the group consisting of methyl, ethyl, phenyl and tertiary butyl. Precursors that contain N—Si bonds are Si-containing precursors because they contain silicon. Si-containing chemical precursors preferably contain less than 9.5% hydrogen atoms, more preferably less than 9.0% hydrogen atoms, by weight based on total weight of Si-containing chemical precursor. Non-limiting examples of preferred Si-containing chemical precursors are $SiF_4$, $SiCl_4$, $HSiCl_3$ and $HSiBr_3$. A highly preferred Si-containing chemical precursor is $H_3SiSiH_2SiH_3$ (trisilane).

Preferred N-containing chemical precursors are selected from the group consisting of $R_mNX_{3-m}$, $X_{2-p}R_pN—NR_pX_{2-p}$, and $XN=NX$; wherein m is 0, 1 or 2; wherein p is 0 or 1; wherein each X is individually selected from the group consisting of F, Cl, H, and D; and wherein each R is individually selected from the group consisting of methyl, ethyl, phenyl and tertiary butyl. Precursors that contain N—Si bonds are N-containing precursors because they contain nitrogen. More preferably, N-containing chemical precursors contain less than about 10% hydrogen atoms, more preferably less than about 8% hydrogen atoms, by weight based on total weight of N-containing chemical precursor. Even more preferably, the N-containing chemical precursor is substantially free of N—H bonds. Non-limiting examples of preferred N-containing chemical precursors include $NF_3$, $NCl_3$, $HN_3$, $F_2NNF_2$, and FNNF.

The chemical precursor can be provided in the form of a solid, liquid or gas, preferably a gas or vapor. A liquid comprised of the chemical precursor can be applied to a substrate and then reacted to form a silicon nitride material on the substrate, preferably by using techniques similar to those that are well-known in the art of spin-coating. Preferably, the chemical precursor is provided in the form of a gas or vapor. In order to minimize contamination and produce a higher quality film, it is preferable to deposit the silicon nitride material onto the substrate by placing or disposing the substrate within a chamber and introducing the chemical precursor to the chamber. Use of a closed chamber is preferred because it permits the introduction of chemical precursors and the exclusion of undesirable species under controlled conditions. The amount of chemical precursor provided is preferably controlled by adjusting the partial pressure of the gas or vapor, which can range from about 0.00001 Torr to atmospheric pressure (about 760 Torr) or even higher, preferably 0.001 Torr to 760 Torr. The amount can also be controlled by intermixing the chemical precursor with another gas and adjusting the total gas pressure or the partial pressure of the chemical precursor in the gas mixture. Optional components of the gas mixture include relatively inert carrier gases such as hydrogen, helium, nitrogen, argon, neon, krypton and xenon. A liquid chemical precursor can be provided by using a bubbler, e.g., by bubbling a carrier gas through the chemical precursor, or by using an evaporator. The amount of chemical precursor in the gas can vary over a broad range, preferably from about 0.01% to 100% by volume.

Deposition is preferably conducted using vapor phase chemical precursors. Preferably, these precursors are deposited onto a substrate by thermal decomposition. Such deposition methods employing vapor phase precursors include atomic layer deposition, chemical molecular beam epitaxy, physical vapor deposition and chemical vapor deposition (including plasma enhanced CVD, photo assisted CVD, laser assisted CVD, etc.).

Chemical vapor deposition (CVD) techniques are preferably used to deposit the silicon nitride material. A wide variety of CVD techniques are known to those skilled in the art. CVD techniques are preferably conducted by creating activated chemical precursors and allowing them to react with one another and/or the surface of the substrate to form a deposit on the substrate. The activated chemical precursors are preferably created by subjecting the chemical precursor to an amount of energy that is effective to decompose the precursor by breaking one or more chemical bonds. The detection, measurement and/or characterization of these activated chemical precursors may be difficult in practice because of their transient nature. Decomposition and activation of the chemical precursor is thus primarily evidenced by the formation of a silicon nitride material and does not require the identification or characterization of any activated chemical precursors, although evidence of the formation of chemically active species may be indicative of activation. PECVD and thermal CVD are preferred CVD techniques, particularly for the deposition of silicon nitride materials in microelectronics manufacturing. These techniques are widely used in the fabrication of integrated circuits, see, e.g., Stephen A. Campbell, "The Science and Engineering of Microelectronic Fabrication," Oxford University Press, New York (1996); Stanley Wolf and Richard N. Tauber, "Silicon Processing for the VLSI Era," Lattice Press, Sunset Beach, Calif. (2000).

Deposition of a silicon nitride material onto a substrate by thermal CVD preferably involves using thermal energy to activate the chemical precursor, preferably by adjusting the temperature of the substrate, so that the activated chemical precursors react with one another or with the substrate to form a deposit. Preferably, the substrate temperature is in the range of about 200° C. to about 700° C., more preferably about 450° C. to about 700° C., even more preferably about 500° C. to about 650° C. If the substrate is already at the deposition temperature, no heating or cooling is required, but in most cases the deposition process involves actively heating or cooling the substrate to the desired temperature, depending upon the starting temperature of the substrate from any previous processing step.

The flow of chemical precursor to the substrate is preferably controlled by manipulating the pressure or partial pressure of the chemical precursor within the thermal CVD chamber. Preferred total pressures are in the range of about 0.001 Torr to about 760 Torr, preferably about 0.5 Torr to about 740 Torr. Preferred partial pressures of chemical precursor are in the range of about 0.00001 Torr to about 760 Torr, preferably about 0.0001 Torr to about 500 Torr. In a particularly preferred embodiment, an integrated circuit is placed into a thermal CVD chamber and heated to a temperature in the range of about 400° C. to about 650° C., and a chemical precursor is added to the CVD chamber to thereby deposit a material, preferably a silicon nitride film, onto the integrated circuit. More preferably, the chemical precursor is one that contains a N—Si bond, even more preferably a chemical precursor of the formula $(X_3Si)_3N$, $(X_3Si)_2N—N(SiX_3)_2$, $(X_3Si)N=N(SiX_3)$, or $(R_{3-m}SiX_m)_3N$ as discussed elsewhere herein.

In PECVD, plasma energy is used to activate the chemical precursor by applying an electromagnetic field, e.g., microwave or radio frequency energy, preferably in the range 13.56 to 27.12 MHz, to the chemical precursor. The activated species then react with one another or with the substrate to deposit a silicon nitride material on the substrate. The plasma may be generated in the immediate vicinity of the substrate or in a remote location. Preferred substrate temperatures during deposition range from about ambient temperature (about 25° C.) to about 650° C., preferably about 450° C. to about 600° C. Preferably, a chamber is employed so that the flow of chemical precursor can also be controlled by manipulating the overall pressure, using a vacuum pump or similar device. Preferred total pressures are in the range of about 0.05 Torr to about 10 Torr, preferably about 0.1 Torr to about 5 Torr. Preferred partial pressures of chemical precursor for PECVD are in the range of about 0.0001 Torr to about 8 Torr, preferably about 0.0001 Torr to about 5 Torr.

Suitable chambers for conducting PECVD are commercially available, and preferred models include the Eagle™ series of reactors commercially available from ASM Japan K. K., of Tokyo, Japan. Suitable chambers for conducting thermal CVD are also commercially available, and preferred models include the Epsilon™ series of single wafer epitaxial reactors, such as the Epsilon 2000®, commercially available from ASM America, Inc. of Phoenix, Ariz. A preferred thermal CVD chamber is a single-wafer, horizontal gas flow reactor. Commercially available CVD chambers are preferably equipped with a number of features, such as computer control of temperature, gas flow and switching, and chamber pressure, that can be manipulated to produce consistently high-quality films suitable for microelectronics applications. Those skilled in the CVD art are familiar with such methods and equipment, and thus routine experimentation may be used to select the appropriate conditions for depositing silicon nitride materials using the chemical precursors described herein.

As discussed elsewhere herein, the composition of the silicon nitride material can vary over a broad range and thus in many cases it may be desirable to provide a mixture of chemical precursors in order to deposit a film having the desired composition. Routine experimentation, using the following guidelines, may be used to select a suitable chemical precursor or mixture thereof and a deposition method which together result in the deposition of a film having the desired chemical composition.

As a starting point, a precursor or mixture of precursors is preferably chosen that has an elemental composition that is relatively close to the desired composition of the silicon nitride material to be deposited. The weight percentage of each element in the precursor or precursor mixture can be readily calculated based on the molecular weight of the precursor and the weight of each precursor in the mixture. Table 2 shows the elemental composition of various chemical precursors and mixtures thereof on a weight percentage basis. For example, to deposit a film that is about 83% silicon, 16% nitrogen and 0.1% hydrogen by weight, $(H_3Si)_3N$ is a suitable starting precursor because it has a similar ratio of silicon to nitrogen atoms with a desirable bonding configuration.

TABLE 2

| Precursor | Si, wt % | N, wt % | H, wt % | F, wt % |
|---|---|---|---|---|
| $(H_3Si)_3N$ | 79 | 13 | 8 | |
| $(H_3Si)_2N\text{-}N(SiH_3)_2$ | 74 | 18 | 8 | |
| Mixture containing: | | | | |
| 25 wt % $NF_3$ and 75 wt % $H_3SiSiH_2SiH_3$ | 68 | 5 | 7 | 20 |

A starting deposition process is preferably selected to utilize the starting chemical precursor or mixture. For instance, thermal CVD is a suitable process for the deposition of silicon nitride using $(H_3Si)_3N$. The deposition temperature can be chosen to control the H-content of the deposited material. Within the ranges of preferred deposition temperatures discussed elsewhere herein, the H-content and the halogen content of the deposited silicon nitride material tends to be lower at higher deposition temperatures. Also, the H-content of the deposited silicon nitride tends to be much lower than the H-content of the starting chemical precursor or mixture.

Having chosen a starting precursor or mixture and a starting deposition process, an initial film can be deposited in the usual manner. In general, the elemental composition of this film will not be identical to the elemental composition of the starting precursor or mixture. For instance, as discussed above, the deposition temperature tends to affect hydrogen and halogen content, as well as the relative rates of precursor decomposition. After depositing the initial film, the starting precursor or mixture and/or process can be adjusted in an iterative fashion to produce a film having the desired composition. Preferably, experimental design methods are used to determine the effect of the various process variables and combinations thereof on chemical composition and/or physical properties of the resulting films. Experimental design methods per se are well-known, see e.g., Douglas C. Montgomery, "Design and Analysis of Experiments," $2^{nd}$ Ed., John Wiley and Sons, 1984. For a particular process, after the effect of the various process variables and combinations thereof on chemical composition and/or physical properties has been determined by these experimental design methods, the process is preferably automated by computer control to ensure consistency in subsequent production.

The composition of the deposited silicon nitride material is preferably adjusted or controlled by providing a supplemental source of an additional desired element or elements, preferably by providing a supplemental silicon source, nitrogen source, oxygen source, germanium source, and/or carbon source. The supplemental source can be provided in various physical forms. For instance, when the chemical precursor is applied to the substrate in the form of a liquid, the liquid can also comprise a supplemental source of the desired additional element, in an amount effective to provide the resulting silicon nitride material with the desired elemental composition.

In the preferred CVD context, a gas is provided which simultaneously comprises the chemical precursor and the supplemental source(s), and the amount of each element in the resulting silicon nitride material is controlled by adjusting the partial pressure of each component using routine experimentation, in accordance with the guidance provided above. For example, as discussed above, the starting mixture of chemical precursor and supplemental source is preferably chosen to have an elemental composition that approximates the elemental composition of the deposited silicon nitride material, as modified by any knowledge of the effect of the particular deposition process chosen. Table 3 shows the overall elemental composition of the chemical precursors shown in Table 2 when combined with various amounts of supplemental sources.

TABLE 3

| Precursor and Supplemental Source | Si, wt % | N, wt % | H, wt % | F, wt % | C, wt % | O, wt % |
|---|---|---|---|---|---|---|
| Mixture containing: | | | | | | |
| 75 wt % $(H_3Si)_3N$ and 25 wt % $O_2$ | 59 | 10 | 6 | | | 25 |
| Mixture containing: | | | | | | |
| 60 wt % $(H_3Si)_2N\text{-}N(SiH_3)_2$ and 25 wt % $H_3SiCH_3$ and 15 wt % $N_2O$ | 59 | 21 | 8 | | 7 | 5 |
| Mixture containing: | | | | | | |
| 20 wt % $NF_3$ and 60 wt % $H_3SiSiH_2SiH_3$ and 20 wt % $(CH_3O)_2SiH_2$ | 61 | 4 | 7 | 16 | 7 | 5 |

Among the supplemental sources, preferred silicon sources include silane, silicon tetrachloride, silicon tetrafluoride, disilane, trisilane, methylsilane, dimethylsilane, siloxane, disiloxane, dimethylsiloxane, methoxysilane, dimethoxysilane, and dimethyldimethoxysilane. Preferred nitrogen sources include diatomic nitrogen ($N_2$), nitrogen trifluoride, nitrogen trichloride, and nitrous oxide. Preferred oxygen sources include oxygen, nitrous oxide, ozone, carbon dioxide, carbon monoxide, hydrogen peroxide, water, methanol, ethanol, dimethylether, diethyl ether, dimethoxyether, and diethoxyether. Preferred germanium sources include germane, digermane, trigermane, methylgermane, dimethylgermane, methoxygermane and dimethoxygermane. Preferred carbon sources include, methylsilane, disilylmethane, trisilylmethane and tetrasilylmethane. Preferred supplemental sources can be a source for two or more elements, e.g., dimethylether can be a source of both carbon and oxygen, dimethylsiloxane can be a source of carbon, oxygen and silicon, etc.

The silicon nitride materials described herein can be subjected to a variety of processes, e.g., patterned, etched, annealed, doped, etc. For example, in the manufacture of integrated circuits, additional layers of other materials such as metal lines or semiconducting layers can be deposited onto the surface of a silicon nitride film formed as described herein. Such deposition can be conducted by providing a silicon source, metal source, germanium source, etc., and depositing the additional layer in the usual manner. In a preferred embodiment, the silicon nitride material is heated to reduce the H-content, preferably by heating to a temperature that is effective to reduce the H-content to about 10 atomic % or less, more preferably 5 atomic % or less, most preferably 3 atomic % or less, based on total atomic content of silicon nitride material.

A preferred embodiment provides a method for controlling the properties of a silicon nitride material. CVD processes which utilize only $NH_3$ as a nitrogen source or only $SiH_4$ as a silicon source tend to produce silicon nitride materials that have a relatively high H-content, particularly at low deposition temperatures. The use of halide-containing nitrogen sources such as $NF_3$ and $NCl_3$ and halide-containing silicon sources such as $SiF_4$ and $SiCl_4$ tends to favorably reduce the H-content of the resulting silicon nitride material, but also tends to increase the halogen content. For some end-use applications a high halogen content is undesirable.

This invention is not bound by theory, but it is believed that PECVD conditions favor the formation of chemically active halogen-containing species. When the hydrogen content of the plasma is relatively low, as in the process of producing a low-H content silicon nitride material, it is believed that these halogen-containing species tend to have a relatively high abundance, low stability towards plasma decomposition into highly reactive species and/or long lifetime in the plasma, and thus tend to become incorporated into the deposited silicon nitride.

For a CVD process that uses a halide-containing chemical precursor to deposit a silicon nitride material, preferably a low H-content silicon nitride material, a preferred embodiment provides a solution to this problem by introducing a hydrogen source to the process in an amount effective to reduce the halogen content of the deposited silicon nitride material. For these purposes, a low H-content silicon nitride material has a hydrogen content of about 15 atomic % or less, preferably about 10 atomic % or less, more preferably about 5 atomic % or less, based on total atomic content of silicon nitride material. This method is applicable to both thermal CVD and PECVD, but is particularly valuable for PECVD. For this purpose, "PECVD" includes all of the various PECVD methods described herein for producing silicon nitride materials, particularly those involving low-H content silicon nitride materials and including those described in the references disclosed herein. All references disclosed herein are hereby incorporated by reference for the express purpose of describing any PECVD processes disclosed therein.

This invention is not bound by theory, but it is believed that, under PECVD conditions, the use of an effective amount of a hydrogen source causes the formation of hydrogen-containing species that react with the halogen-containing species to form gaseous species which are relatively easy to remove in-vacuo and which contain relatively strong hydrogen-halogen bonds that are relatively difficult to disrupt, thus reducing the abundance and/or lifetime of the halogen-containing species in the plasma and decreasing the amount of halogen incorporated into the deposited silicon nitride material.

Preferred hydrogen sources include molecules represented by the formula $SiH_nX_{4-n}$, wherein n is 1, 2 or 3 and X is F or Cl. Non-limiting examples of preferred hydrogen sources include $SiCl_2H_2$, $SiCl_3H$, $SiBr_2H_2$, and $SiBr_3H$. Preferred hydrogen sources may be introduced as a component of a carrier gas and may be mixed with other hydrogen sources such as $H_2$. The amount of hydrogen source may be controlled by controlling the pressure of the hydrogen source or the partial pressure of the hydrogen source in the gas mixture. The methods of this embodiment are particularly effective when the halide-containing chemical precursor is selected from the group consisting of $SiCl_4$, $SiF_4$, $NCl_3$, $NF_3$ and $HN_3$.

The hydrogen source is preferably used in an amount that is effective to reduce the halogen content of the low H-content silicon nitride material as compared to when the hydrogen source is not used, more preferably to reduce the halogen content to about 10% or less, even more preferably about 5% or less, by weight based on total weight of silicon nitride material. Most preferably, the amount of hydrogen source is controlled so that it does not undesirably increase the hydrogen content of the deposited low H-content silicon nitride material. Routine experimentation may be used to select an amount of hydrogen source that provides the desired balance of low H-content and low halogen content in the deposited silicon nitride material. A preferred amount of hydrogen source is in the range of about 0.001% to about 10%, more preferably about 0.01% to about 5%, by weight based on the weight of the halide-containing chemical precursor.

The various deposition processes described herein can be conducted in a layer-by-layer fashion to create novel composite materials having unique properties. This can be accomplished by varying the composition of the precursor or precursor mixture, continuously or in steps, during the deposition process. For example, a film comprising Si—N and Si—O—N can be made by first depositing a layer of Si—O—N using $(H_3Si)_3N$ and $O_2$, then decreasing the $O_2$ to deposit a layer of Si—N. The amount of $O_2$ can be gradually ramped down to provide a graded transition layer or decreased in a stepwise fashion to create a silicon nitride material having a more distinct interface between the Si—O—N and Si—N layers. Such techniques can be used to improve adhesion to underlying or overlying layers or to provide a material with a surface coating having properties that differ from those of the bulk material.

The silicon nitride materials described herein are useful for a variety of applications, particularly those for which low H-content is desirable. Non-limiting examples of such applications include coatings for silicon dioxide layers (nitrided silicon dioxide gate dielectric layers) in order to improve device properties e.g., to increase dielectric constant, reduce hot electron effects, limit boron diffusion, form a p+ polysilicon gate, and to prolong the life of the device. Other applications include antireflective coatings in photolithography process steps, passivation layers and spacer materials in transistors, insulators between metal levels, masks to prevent oxidation and diffusion, particularly metal diffusion barriers, preferably copper metal diffusion barriers, and for use as hardmasks in etch process steps, preferably as etch masks in multilevel photoresist structures.

For applications such as copper metal diffusion barriers, the silicon nitride material is preferably amorphous. The deposition of amorphous materials is favored by the use of lower deposition temperatures, preferably about 550° C. or below, more preferably about 450° C. to about 550° C. All references disclosed herein are hereby incorporated by reference for the express purpose of describing any applications for low H-content silicon nitride materials.

The N-containing molecules described herein are also useful as low-temperature doping materials, e.g., for doping β-silicon carbide with nitrogen. β-Silicon carbide can be deposited at low temperature using a range of chemical precursors including methylsilane. Deposition of β-silicon carbide on a silicon carbide substrate at 550° C. to 650° C. using trisilylamine as a dopant enables deposition of n-type low H-content silicon carbide at reduced temperature. Preferably, deposition of nitrogen-doped β-silicon carbide is conducted at 60 Torr for 15 minutes onto a SiC substrate heated to 600° C. Preferably, methylsilane is used at a flow rate of 25 sccm, along with a trisilylamine mixture of 100 ppm in $H_2$ at a flow rate of 10 sccm and $H_2$ carrier gas flow rate of 20 slm.

It will be understood by those of skill in the art that numerous and various modifications can be made without departing from the spirit of the present invention. Therefore, it should be clearly understood that the various embodiments discussed above and described in the examples below are illustrative only and are not intended to limit the scope of the present invention.

EXAMPLES

In the Examples below, the hydrogen content of the deposited films was measured by Rutherford backscattering spectroscopy ("RBS") using elastic recoil detection ("ERD") and confirmed by Fourier-transform infrared spectroscopy ("FTIR"). The overall silicon and nitrogen composition of each film was also determined by 2 MeV Rutherford Backscattering spectroscopy (RBS).

Examples 1–5

A quartz tube, enclosed in a clamshell tube furnace, having an inlet and outlet was equipped with a pre-mix chamber and mass flow controller. Five silicon workpieces were placed along the length of the furnace. The mass flow controller was used to supply the heated quartz tube with a gas mixture comprised of a partial pressure of about 400 Torr of nitrogen and 135 Torr of trisilylamine. The furnace temperature was maintained at about 550° C. The gas mixture was introduced into the furnace at a flow rate of about 20 standard cubic centimeters per minute ("sccm") and a pressure of about 1.05 Torr, and continued for about 15 minutes. The gas mixture was thermally activated as it flowed along the length of the furnace to the outlet and on the surfaces of the workpieces, thereby depositing silicon nitride films on each of the seven workpiece substrates.

The silicon to nitrogen ratio ("silicon:nitrogen") was determined by RBS to be about 3:1 for all five films. All five films had a thickness in the range of about 4000 Å to about 6000 Å. The hydrogen content of each film, as determined by RBS/ERD, was about 4 atomic % (about 0.175% by weight based on total film weight).

Examples 6–12

Films were deposited as described in Examples 1–5, except that seven workpieces were present in the furnace, the furnace temperature during deposition was about 475° C., the gas flow rate was about 3–5 sccm, the gas pressure during deposition was about 0.001 Torr, and the deposition was carried out for about one hour. Silicon:nitrogen was determined by RBS to be about 3:1 for all seven films. All seven films had a thickness in the range of about 1500 Å to about 3000 Å. The hydrogen content of each film, as determined by RBS/ERD, was about 4 atomic % (about 0.175% by weight based on total film weight).

Examples 13–17

Films are deposited as described in Examples 1–5, except that the gas mixture is comprised of a partial pressure of about 200 Torr of trisilane, about 150 Torr of $NF_3$ and 400 Torr of nitrogen ($N_2$). Silicon:nitrogen is about 6:1 for all films and the hydrogen content of each film is less than about 1%, by weight based on total film weight.

Example 18

A gas containing $H_2SiCl_2$ having a partial pressure equal to 1% of the total pressure, $NF_3$ having a partial pressure equal to 2.5% of the total pressure, $SiCl_4$ having a partial pressure equal to about 6.5% of the total pressure and helium carrier gas having a partial pressure equal to about 90% of the total pressure is introduced into a PECVD reactor chamber maintained at a pressure of 2 Torr that contains a silicon substrate maintained at 550° C. A plasma is initiated in this gas mixture using 13.56 MHz radiation at a power level of 2.0 Watts per square centimeter of substrate surface area to deposit a silicon nitride film on the substrate. The silicon nitride film has silicon:nitrogen of about 2:1. The film has a hydrogen content of about 1% and a chlorine content of about 5%, by weight based on total film weight.

I claim:

1. A process for depositing a silicon nitride material from vapor phase precursors on a surface, comprising providing a deposition chamber having disposed therein a substrate; and introducing a chemical precursor to said chamber, thereby depositing a silicon nitride material onto said substrate by thermal decomposition, wherein said chemical precursor is selected from the group consisting of $(X_3Si)_3N$, $(X_3Si)_2N—N(SiX_3)_2$, $(X_3Si)N=N(SiX_3)$, and $(R_{3-m}SiX_m)_3N$; wherein m is 0, 1 or 2; wherein each X is individually selected from the group consisting of F, Cl, Br, H and D; and wherein each R is individually selected from the group consisting of methyl, ethyl, phenyl and tertiary butyl.

2. The process as claimed in claim 1 wherein said chemical precursor is $(H_3Si)_3N$.

3. The process as claimed in claim 1 wherein said silicon nitride material, as deposited, has a hydrogen content of about 10 atomic % or less.

4. The process as claimed in claim 3 which further comprises heating said silicon nitride material.

5. The process as claimed in claim 4 wherein said heating is effective to reduce said hydrogen content to about 5 atomic % or less.

6. The process as claimed in claim 1 which further comprises introducing a nitrogen source while introducing said chemical precursor, wherein said nitrogen source is selected from the group consisting of $NF_3$ and $NCl_3$.

7. The process as claimed in claim 1 which further comprises introducing a silicon source while introducing said chemical precursor, wherein said silicon source is selected from the group consisting of $SiCl_4$ and $SiF_4$.

8. The process as claimed in claim 1 which further comprises introducing a supplemental source while introducing said chemical precursor, wherein said supplemental source is selected from the group consisting of oxygen source, carbon source and germanium source.

9. The process as claimed in claim 1 wherein said silicon nitride material is selected from the group consisting of Si—N, Si—O—N, Si—C—N and Si—O—C—N.

10. The process as claimed in claim 1 wherein said silicon nitride material, as deposited, has a hydrogen content of about 4 atomic % or less.

11. The process as claimed in claim 1 wherein said thermal decomposition is thermal chemical vapor deposition.

12. The process as claimed in claim 11 wherein said thermal chemical vapor deposition is conducted at a temperature in the range of about 450° C. to about 700° C.

* * * * *